United States Patent [19]

Johnston

[11] Patent Number: 5,748,949

[45] Date of Patent: May 5, 1998

[54] COUNTER HAVING PROGRAMMABLE PERIODS AND METHOD THEREFOR

[75] Inventor: Thomas K. Johnston, Austin, Tex.

[73] Assignee: Motorola Inc., Schaumburg, Ill.

[21] Appl. No.: 674,381

[22] Filed: Jul. 2, 1996

[51] Int. Cl.$^6$ .................... G06K 1/025; H03K 23/00
[52] U.S. Cl. ............................ 395/557; 377/52
[58] Field of Search ................. 395/557; 331/1 A; 377/47, 52, 110

[56] References Cited

U.S. PATENT DOCUMENTS

| | | | |
|---|---|---|---|
| 4,443,887 | 4/1984 | Shiramizu | 377/110 |
| 4,891,825 | 1/1990 | Hansen | 377/52 |
| 4,935,944 | 6/1990 | Everett | 377/48 |
| 4,975,931 | 12/1990 | Cosand | 377/52 |
| 5,127,036 | 6/1992 | Pham | 377/47 |
| 5,365,119 | 11/1994 | Kivari | 327/115 |
| 5,390,223 | 2/1995 | Lindholm | 377/49 |
| 5,425,074 | 6/1995 | Wong | 377/47 |
| 5,526,391 | 6/1996 | Shankar et al. | 377/47 |
| 5,548,787 | 8/1996 | Okamura | 395/845 |

*Primary Examiner*—Thomas M. Heckler

[57] ABSTRACT

A counter (200) generates signals which have an average period of a non-integer multiple of an input clock period. Through the use of this non-integer multiple period, non-integer division operations are executed and used in circuits such as pulse width modulators (800) and phase lock loops (900). Additionally, when the counter (200') is used with a Gray coded counter, the average duty cycle of all bits is exactly equal to 50%.

13 Claims, 6 Drawing Sheets

FIG.1
-PRIOR ART-
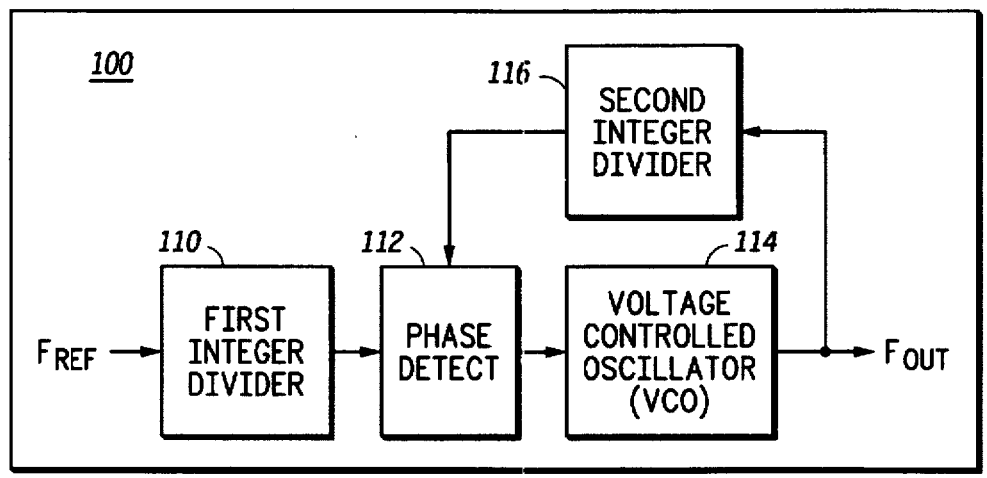
FIG.2
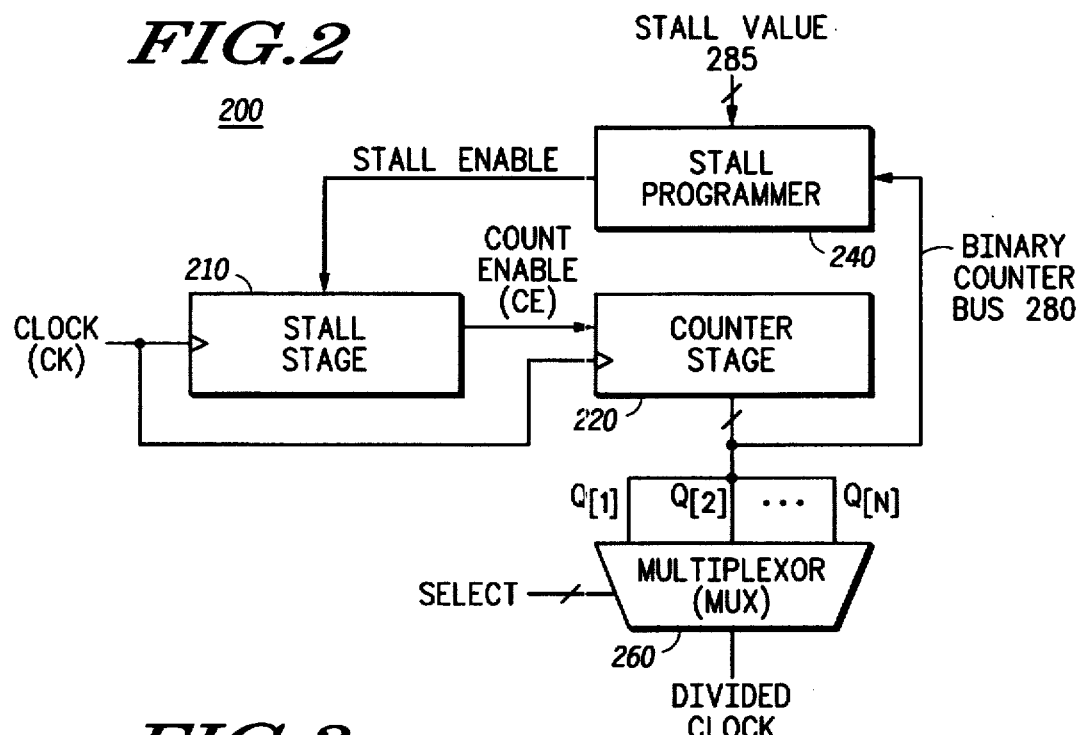
FIG.3
| STALL STAGE STATUS | | |
|---|---|---|
| STALL ENABLE | COUNT ENABLE (t-1) | COUNT ENABLE (t) |
| 0 | 0 | X |
| 0 | 1 | 1 |
| 1 | 0 | 1 |
| 1 | 1 | 0 |

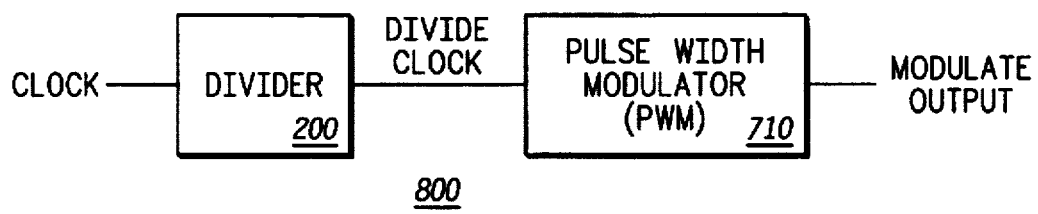
FIG.8
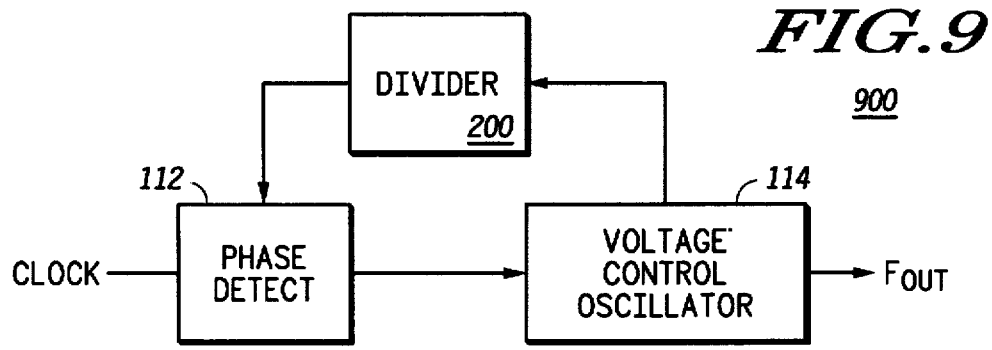
FIG.9
FIG.10
| COUNTER STATE Q[4:1] | | | | STALL ENABLE | STALL VALUE X=0101 COUNTER RANGE=0 | TIME SINCE LAST CHANGE Q[4:1] | | | |
|---|---|---|---|---|---|---|---|---|---|
| 0 | 0 | 0 | 0 | X[4] | 0 | 1 | 1 | 1 | 1 |
| 0 | 0 | 0 | 1 | X[3] | 1 | 2 | 2 | 2 | 1 |
| 0 | 0 | 1 | 0 | X[4] | 0 | 3 | 3 | 1 | 1 |
| 0 | 0 | 1 | 1 | X[2] | 0 | 4 | 4 | 2 | 1 |
| 0 | 1 | 0 | 0 | X[4] | 0 | 5 | 1 | 1 | 1 |
| 0 | 1 | 0 | 1 | X[3] | 1 | 6 | 2 | 2 | 1 |
| 0 | 1 | 1 | 0 | X[4] | 0 | 7 | 3 | 1 | 1 |
| 0 | 1 | 1 | 1 | X[1] | 1 | 8 | 4 | 2 | 1 |
| 1 | 0 | 0 | 0 | X[4] | 0 | 1 | 1 | 1 | 1 |
| 1 | 0 | 0 | 1 | X[3] | 1 | 2 | 2 | 2 | 1 |
| 1 | 0 | 1 | 0 | X[4] | 0 | 3 | 3 | 1 | 1 |
| 1 | 0 | 1 | 1 | X[2] | 0 | 4 | 4 | 2 | 1 |
| 1 | 1 | 0 | 0 | X[4] | 0 | 5 | 1 | 1 | 1 |
| 1 | 1 | 0 | 1 | X[3] | 1 | 6 | 2 | 2 | 1 |
| 1 | 1 | 1 | 0 | X[4] | 0 | 7 | 3 | 1 | 1 |
| 1 | 1 | 1 | 1 | COUNTER RANGE | | 0 | 8 | 4 | 2 | 1 |
| MINIMUM CARE TIME SINCE LAST CHANGE: | | | | | | 8 | 4 | 2 | 1 |

COUNTER HAVING PROGRAMMABLE PERIODS AND METHOD THEREFOR

FIELD OF THE INVENTION

This invention relates generally to a counter having programmable periods, and more specifically to a counter capable of performing non-integer division.

BACKGROUND OF THE INVENTION

Frequency divider counters generally provide an output clock signal having a frequency that is lower than a frequency of an input clock signal. Furthermore, frequency divider counters are commonly used to step down a system frequency for certain circuits in a system which requires a lower operating frequency than a system clock frequency.

In a first type of counter, a programmable binary counter, the counter counts a certain length sequence and then restarts. If this counter ever enters a state which is not in a programmed count sequence from a starting value to the reset value, the counter may require a significant amount of time to return to the programmed sequence. Such a requirement can be both time consuming and inefficient depending on the user's system. Furthermore, programmable binary counters can only divide an input frequency by an integer value. Because of the requirement that the counter restart at a certain set value, some programmable value counters will have least significant bits which have very asymmetric duty cycles. Furthermore, because of the restart requirement, the most significant bits of such programmable binary counters may not toggle at all.

A second type of counter which is common in data processing industry is an LFSR (Linear Feedback Shift Register) counter. An LFSR register is also known as a polynomial counter or a pseudo-random counter. LFSR counters can operate at very high frequencies. However, they are difficult to program and are often used as a fixed period prescaler which is applied to a lower frequency secondary counter. Typically, the secondary counter is a programmable binary counter such as that described above. Therefore the same problems associated with using the programmable binary counter are also applicable to systems using an LFSR counter. Again, LSFR counters can only provide integer multiples of a prescaler period.

Another prior art implementation is a dual modulus counter. The dual modulus counter provides a very high frequency operation. However, it is used exclusively as a prescaler feeding a lower frequency secondary counter. Again this secondary counter is usually a programmable binary counter. A dual modulus prescaler with a secondary counter can divide by any integer value greater than the square of the dual modulus counter period. However, half of the integer values less than this are unobtainable.

None of the prior art implementations provided above produce the 50% duty cycle output required for some applications. Furthermore, neither of the prior art solutions described above provides counter periods which correspond to harmonics or sub-harmonics of the input signal. Most importantly, none the prior art solutions described above are capable of a non-integer frequency division. Such non-integer frequency division is commonly required in data communication applications, speech synthesis applications, and phase lock loop applications. Additionally it should be understood that non-integer frequency division might be required in other applications as well.

In order to provide the capability of non-integer frequency division, most prior art systems have had to implement a phase lock loop (PLL). A PLL can divide a reference frequency by adding a divider at a reference input of a phase comparator. It also offers a unique capability of multiplying the reference frequency by adding a divider at an oscillator input of the phase comparator. With both reference and oscillators dividers, a PLL can multiply or divide the reference frequency at a ratio of the oscillator and reference dividers. This ratio can be a non-integer number. While PLL's provide an adequate solution for performing non-integer division, PLL's have several drawbacks. For example, PLL's are generally large circuits which require a substantial amount of circuitry and, therefore, high overhead. Additionally, PLL's consume a substantial amount of power. In modern data processing applications which require minimum power consumption, the power consumption requirements of a PLL may be limited. Furthermore, most PLL circuits are implemented as analog devices. Such analog devices are noise sensitive as well as fabrication sensitive. Lastly, to compensate for process sensitivity, PLL circuits require an added external integrated circuit pin. Such a requirement is often limiting and may not be applicable in many data processing systems. In other implementations, on-chip components of a PLL circuit may be laser-trimmed. This process, however, requires special assembly equipment which increases the overhead associated with manufacturing the PLL circuit.

Thus, it may be seen that a need exists for a counter circuit which can divide by a non-integer number without requiring the use a PLL circuit. Lower overhead, lower power consumption, and less sensitivity to noise and fabrication are all desired in a counter.

BRIEF DESCRIPTION OF THE DRAWINGS

FIG. 1 illustrates, in block diagram form, a prior art implementation of a phase lock loop circuit;

FIG. 2 illustrates, in block diagram form, a count circuit in accordance with one embodiment of the present invention;

FIG. 3 illustrates, in tabular form, a stall stage status table in accordance with the count circuit of FIG. 2;

FIG. 8 illustrates, in block diagram form, a first application of the present invention;

FIG. 9 illustrates, in block diagram form, a second application of the present invention; and FIG. 10 illustrates, in graphical form, a table indicating a speed path determination corresponding with the present invention.

DETAILED DESCRIPTION OF A PREFERRED EMBODIMENT

Figure 4:
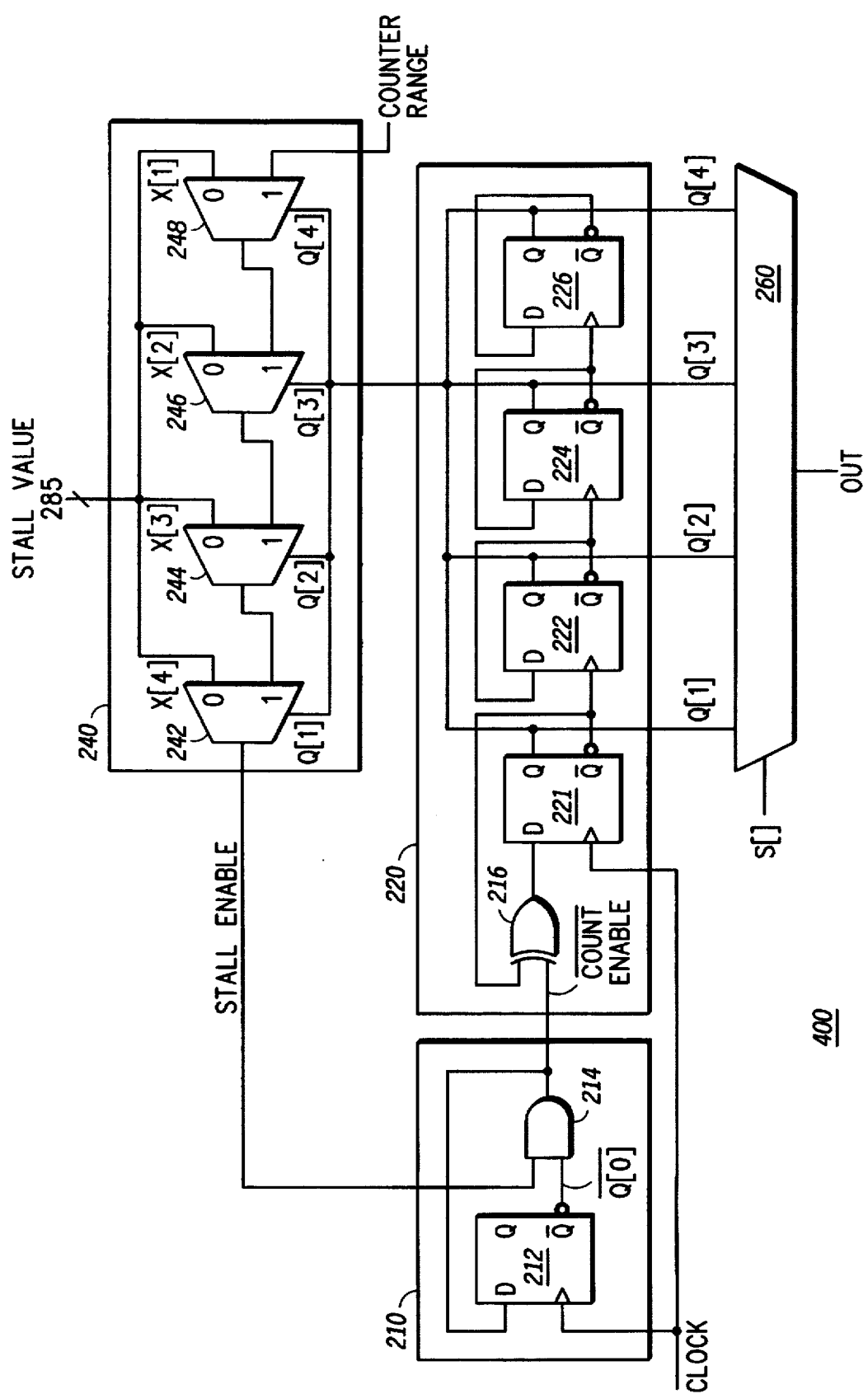
FIG. 4 illustrates, in block diagram form, a more detailed diagram of a counter circuit provided in accordance with one embodiment of the present invention.

The present invention provides a counter and method which is capable of generating signals which have an average period of a non-integer multiple of an input clock period. The average period of the generated signals will subsequently be described in further detail. Through the use of this non-integer multiple period, the present invention is capable of implementing non-integer division operations for use in circuits such as pulse width modulators (PWM's) and phase lock loops (PLL's). Additionally, when the present invention is used with a Gray coded counter, the present invention is able to provide a counter in which the average duty cycle of all bits is exactly equal to 50%. Such a function is especially important in communications applications such as Manchester encoding.

The present invention is capable of performing each of these operations using significantly less circuitry than was required by prior art implementations. Additionally, because this is a digital implementation and not analog, as required by many prior art solutions, the present invention is not bounded by the limits of that analog technology. For example, the present invention requires less overhead, less circuit area, less power consumption, and is not as noise sensitive as its analog counterparts. For these reasons, the present invention provides an advantageous solution to problems originally solved by the prior art implementations discussed in the Background of the Invention section of this application. In the following discussion, the connectivity and operation of one embodiment of a counter which implements the present invention will be provided in greater detail.

Connectivity of the Invention

In the following description of the connectivity of the present invention the term "bus" will be used to refer to a plurality of signals or conductors which may be used to transfer one or more various types of information such as data, addresses, control, or status. The terms "assert" and "negate" will be used when referring to the rendering of a signal, status bit, or similar apparatus into its logically true or logically false state, respectively. If the logically true state is a logic level one, the logically false state will be a logic level zero. If the logically true state is a logic level zero, the logically false state will be a logic level one. Furthermore, the symbol "$" preceding a number indicates that the number is represented in its hexadecimal or base 16 form. The symbol "%" preceding a number indicates that the number is represented in its binary or base two form. In the following description of the present invention, it should be noted that the terms "field" and "bit" may be used interchangeably.

FIG. 2 illustrates a counter 200 in accordance with one embodiment of the present invention. Counter 200 includes a stall stage 210, a counter stage 220, a stall programmer 240, and a multiplexer 260. A clock (CK) signal is connected to an enable input of stall stage 210 and an enable input of counter stage 220. An output of stall stage 210, a count enable (CE) signal, is connected to an input of counter stage 220. An output of counter stage 220 provides a binary counter bus 280. Binary counter bus 280 provides a plurality of signals respectively labeled Q[1], Q[2], through Q[n]. Each of the signals Q[1] through Q[n] is providing a bit of a counter value. Binary counter bus 280 is coupled from counter stage 220 to each of stall programmer 240 and multiplexer 260. Stall programmer 240 also receives a Stall Value bus 285 and provides a stall enable signal to stall stage 210. Furthermore, a select signal is provided to multiplexer 260; multiplexer 260 provides a divided Clock signal.

FIG. 4 illustrates a more detailed drawing of one embodiment of encounter 200. In the alternate embodiment of counter 200 illustrated in FIG. 4., this embodiment of the counter includes stall stage 210, counter stage 220, stall programmer 240, and multiplexer 260 as originally illustrated in FIG. 2. In the embodiment of the invention illustrated in FIG. 4, stall stage 210 includes a latch 212 and an AND gate 214. In stall stage 210, the Clock signal is provided to an enable input of latch 212, a $\overline{Q}$ output of latch 212 is inverted and provided to a first input of AND gate 214. This is a $\overline{Q[0]}$ signal. The stall enable signal is provided to a second input of AND gate 214. An output of AND gate 214 is coupled to a first input of exclusive-OR gate 216 as well as a D input of latch 212 to provide a $\overline{\text{Count Enable}}$ signal.

Additionally in FIG. 4, stall programmer 240 is illustrated in greater detail. As illustrated, stall programmer 240 includes a first multiplexer 242, a second multiplexer 244, a third multiplexer 246 and a fourth multiplexer 248. The Stall Value bus is coupled to each of the multiplexers of stall programmer 240. The Stall Value bus provides an X[4] signal to zero input of multiplexer 242. The Stall Value bus provides an X[3] value to a zero input of multiplexer 244, an X[2] value to a zero input of multiplexer 246, and an X[1] value to a zero input of multiplexer 248. A counter range signal is coupled to a one input of multiplexer 248. An output of multiplexer 248 is coupled to a one input of multiplexer 246. Additionally, an output of multiplexer 246 is coupled to a one input of multiplexer 244. An output of multiplexer 244 is coupled to a one input of multiplexer 242. An output of multiplexer 242 and stall programmer 240 provides a stall enable signal to a second input of AND gate 214 of stall stage 210.

FIG. 4 also illustrates counter stage 220 in greater detail. Counter stage 220 includes exclusive-OR 216, first latch 221, a second latch 222, a third latch 224, and fourth latch 226. An output of exclusive-OR gate 216 of stall stage 210 is coupled to a D input of latch 221. Additionally, the Clock signal is coupled to an enable input of latch 221. A Q output of latch 221 is coupled to an enable input of multiplexer 242 of the stall programmer 240. A $\overline{Q}$ output of latch 221 is coupled to an enable input of latch 222. The Q output of latch 221 is coupled to a first input of multiplexer 260. The $\overline{Q}$ output of latch 221 is coupled to a second input of exclusive-OR gate 216 of stall stage 210. A Q output of latch 222 is coupled to an enable input of multiplexer 244 of stall programmer 240. The Q output of latch 222 is also coupled to second input of multiplexer 260. A $\overline{Q}$ output of latch 222 is coupled to both an enable input of latch 224 and a D input of latch 222. A Q output of latch 224 is coupled to an enable input of multiplexer 246 of stall programmer 240, and a third input of multiplexer 250. A $\overline{Q}$ output of latch 224 is coupled to both an enable input of latch 226 and a D input of latch 224. Lastly, a Q output of latch 226 is coupled to an enable input of multiplexer 248 of stall programmer 240 and a fourth input of multiplexer 260. A $\overline{Q}$ output of latch 226 is coupled to a D input of latch 226. An S[] input is coupled to a select input of multiplexer 260. Multiplexer 260 provides the divided Clock signal.

Figure 6:
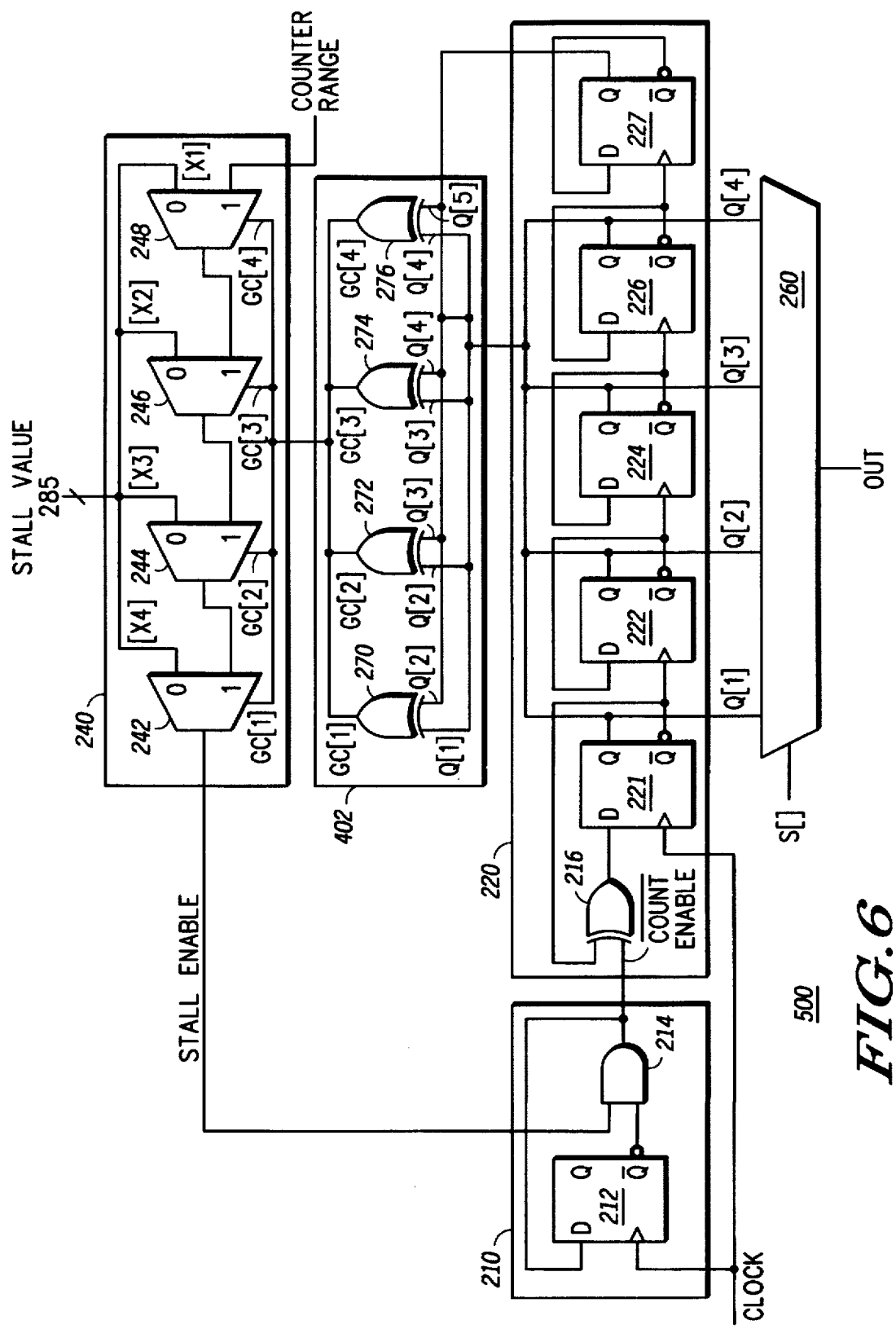
FIG. 6 illustrates, in block diagram form, a more detailed diagram of a counter circuit provided in accordance with a second embodiment of the present invention.

FIG. 6 illustrates a second alternate embodiment of the counter of the present invention. FIG. 6 illustrates a counter which implements Gray encoding and augments the ripple implementation illustrated in FIG. 4. As illustrated in FIG. 6, counter 200' includes a latch 212, an AND gate 214, an exclusive-OR gate 216, a latch 221, a latch 222, a latch 224, a latch 226, a latch 227, a multiplexer 242, a multiplexer 244, a multiplexer 246, a multiplexer 248, an exclusive-OR gate 270, an exclusive-OR gate 272, an exclusive-OR gate 274, an exclusive-OR gate 276 and a multiplexer 260. As illustrated in FIG. 4, it should be noted that latch 212 and AND gate 214 comprise stall stage 210. Additionally, exclusive-OR gate 216, latch 221, latch 222, latch 224, latch 226 and latch 227 comprise counter stage 220. Furthermore, multiplexers 242 through 248 comprise stall programmer 240. In counter 200', the clock signal is provided by an enable input of latch 212 and an enable input of latch 221.

A $\overline{Q}$ output of latch 212 is coupled to a first input of AND gate 214. An output of AND gate 214 is coupled to a D-input of latch 212 and a first input of exclusive-OR gate 216 to provide a $\overline{\text{Count Enable}}$ signal. An output of exclusive-OR gate 216 is coupled to a D input of latch 221. A Q output of latch 221 is coupled to a first input of exclusive-OR gate 270 and a first input of multiplexer 260. A $\overline{Q}$ output of latch 221 is coupled to an enable input of latch 222 and a second input of exclusive-OR gate 216. A Q output of latch 222 is coupled to a first input of exclusive-OR gate 272, a second input of exclusive-OR gate 270 and a second input of multiplexer 260. A $\overline{Q}$ output of latch 222 is coupled to an enable input of latch 224 and a D input of latch 222. A Q output of latch 224 is coupled to a second input of exclusive-OR gate 272, a first input of exclusive-OR gate 274, and a third input of multiplexer 260. A $\overline{Q}$ output of latch 224 is coupled to an enable input of latch 226 and a D input of latch 224. A Q output of latch 226 is coupled to a second input of 274, a first input of exclusive-OR gate 276 and a fourth input of multiplexer 260. A $\overline{Q}$ output of latch 226 is coupled to an enable input of latch 227 and a D input of latch 226. A Q output of latch 227 is coupled to a second input of exclusive-OR gate 276. A $\overline{Q}$ output of latch 227 is coupled to a D input of latch 227. A select input is provided to multiplexer 260 which, in turn, provides the divided Clock signal. An output of exclusive-OR gate 270, a Gray Count 1(GC[1]) signal is coupled to an enable input of multiplexer 242. Similarly, an output of exclusive-OR gate 272, a Gray Count 2(GC[2]) signal is coupled to an enable input of multiplexer 244. An output of exclusive-OR gate 274 provides a Gray Count 3(GC[3]) signal to an enable input of multiplexer 246. As well, an output of exclusive-OR gate 276 provides a Gray Count 4(GC[4]) signal to an enable input of multiplexer 248. Additionally, a counter range signal is provided to a one input of multiplexer 248.

The Stall Value bus provides a plurality of signals respectively labeled X[4], X[3], X[2] and X[1] to each of the multiplexers 242 through 248. An X[4] signal is provided to a zero input of multiplexer 242. An X[3] signal is provided to zero input of multiplexer 244. An X[2] signals is provided to a zero input of multiplexer 246. An X[1] signal is provided to zero input of multiplexer 248. An output of multiplexer 248 is coupled to a one input of multiplexer 246. Similarly, an output of multiplexer 246 is coupled to a one input of multiplexer 244 and an output of multiplexer 244 is coupled to a one input of multiplexer 242. Multiplexer 242 provides the stall enable signal to a second input of AND gate 214.

FIG. 8 illustrates a first application of the present invention. FIG. 8 illustrates a pulse width modulation system including a divider 200 and a pulse width modulator (PWM) 710. In the pulse width modulation system 700 if FIG. 8, a Clock signal is provided to divider 200. Divider 200 provides a divided Clock signal to pulse width modulator 710 which generates a modulate output signal.

FIG. 9 illustrates a second application of the present invention. FIG. 9 illustrates a phase lock loop (PLL) system. In the PLL system 800 of FIG. 9 a clock input is provided to a phase detect circuit 112. An output of the phase detect circuit 112 is provided to a voltage controlled oscillator (VCO) 114. VCO 114 provides a $F_{out}$ signal. Additionally, VCO 114 is coupled to divider 200. Divider 200 is coupled to phase detect 112.

Description of Operation

As illustrated in FIG. 2, counter 200 of the present invention includes a counter stage 220, a stall programmer 240, a stall stage 210 and an optional output multiplexer 260. During operation of counter 200, a Clock signal is provided to both stall stage 210 and counter stage 220. During operation of counter 200 and before the counting operation begins, an external user provides a stall value via Stall Value bus 285 to stall programmer 240. Stall programmer 240 stores that value and uses it to generate a Stall Enable signal. It should be noted that the stall value provided via Stall bus 285 indicates a number of clock cycles to be added to a period associated with a most significant bit of a counter value generated by counter stage 220. The stall value is provided to stall programmer 240 which generates a Stall Enable signal. In response to both the Stall Enable signal and an incoming clock (CK) signal, stall stage 210 generates a count enable (CE) signal. The count enable signal enables counter stage 220 to count on every rising edge of the input Clock signal when the Stall Enable signal is unasserted. Additionally, the counter enable signal enables counter stage 220 to count on every second rising edge of the Clock signal when the Stall Enable signal is asserted. A state which counter stage 220 is in when the Stall Enable signal is asserted, is able to persist for one or two clock periods only. When the stall signal is never asserted, a base period of counter stage 220 is $2^n$ clock periods, where n is a number of bits of counter stage 220. In each counter state that the Stall Enable signal is asserted, an extra clock period is added to the base period of counter stage 220.

The value of the stall value stored in stall programmer 240 is the number of extra clock periods which are added to the base period of counter stage 220. Thus, the actual period of the counter's most significant bit, Q[n], is $2^n+X$. The period of Q[n] increments in steps of one clock period. In a first embodiment of the invention, assume that counter stage 220 counts in a binary sequence. Therefore Q[n-1] completes two cycles in this period. Additionally Q[n-2] completes four cycles and Q[n-3] completes eight cycles. The average period of any counter bit Q[i] is:

$$[(2^n+X)/2^{n-i}] \times P \qquad (1)$$

The average period of Q[i] increments in steps of $\frac{1}{2}^{n-i}$, and the steps may be non-integers where "i" is less than "n". Any individual period measured between consecutive rising edges of Q[i] is actually the nearest integer multiple of clock periods either above or below the average. Longer periods and shorter periods of Q[i] are automatically intermixed in a ratio to produce an average period measured between consecutive rising edges of a most significant Q[n].

Figure 5:
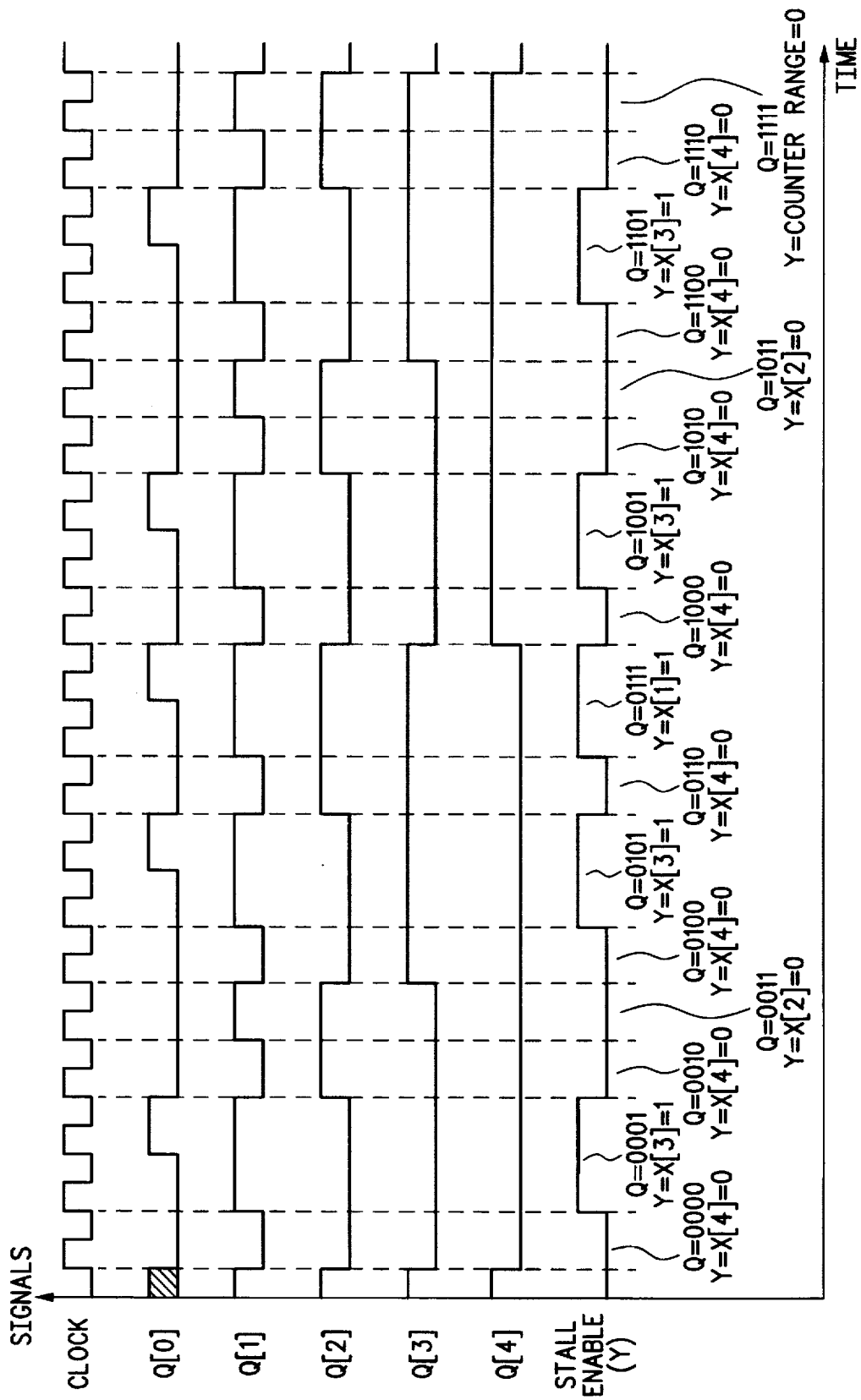
FIG. 5 illustrates, in graphical form, a timing diagram illustrating one embodiment of the timing signals of the present invention.

As an example of calculation of the average period of Q[i], refer to FIG. 5 where X=5 and n=4. From Equation (1), for i=4, the period of Q[4] is calculated to be 21 periods of the Clock signal. This period of Q[4] is illustrated in FIG. 5. Similarly, for i=3, the average period of Q[3] is calculated to be 10.5 periods of the Clock signal. This is illustrated in the average of the two periods of Q[3] measured over the full period of Q[4].

Additionally, in some embodiments, a Counter Range signal can be included and Equation (1) becomes:

$$\text{Average Period of } Q[i] = [(2^n+X+R)/2^{n-i}] \times P \qquad (1')$$

where:

n=number of bits of a counter (an "order of the system");

i=any number from 1 to n;

X=any number from 0 to $(2^n-1)$;

R=0 or 1 (R is the Counter Range signal).

When Equation (1') is used, the minimum divided clock period which may be produced from such a counter implementation is (2×P). The maximum divided clock period which may be produced from such a counter implementation is $(2^{n+1} \times P)$. A number of possible average divided clock periods which this counter can produce is $(n \times 2^n+1)$. It should be noted that Equation (1') and the functions described herein are valid for a binary embodiment.

Counter stage 220 always counts through its entire state sequence and does not count a partial sequence and then restart. Stall programmer 240 adds extra clock period evenly distributed through the complete counter cycle, so that every counter bit has the best possible approximation of 50% duty cycles where required. Furthermore, it should be noted that the counter 200 does not have to be reset to operate in its normal state sequence because every possible counter or Q state is in the normal state sequence. Therefore, regardless of the reset state of the stall value or the select value as implemented, counter stage 220 is able to begin counting with the correct period immediately.

It should be noted that stall stage 210 provides the Count Enable signal in response to the Stall Enable signal and the previous state of the Count Enable signal. This relationship is illustrated in greater detail in FIG. 3. As illustrated in FIG. 3, when the Stall Enable signal is negated and the previous count enable value is also negated, a next value of the Count Enable signal is a "don't care" because this situation should never occur. However, when the Stall Enable signal is a zero and the previous Count Enable signal was asserted, a resulting current Count Enable signal will be equal to a logic one value to indicate that counter stage 220 should continue to count in a normal progression. Similarly, when the Stall Enable signal is asserted and the previous Count Enable signal was negated, a resulting Count Enable signal will also be asserted because counter stage 220 was already stalled for one clock period and counter stage. 220 can't be stalled for longer than that time period in the embodiment of the invention illustrated herein. When Stall Enable signal is asserted and the previous Count Enable signal is asserted, the current Count Enable signal is negated to indicate that counter stage 220 should stall for one clock period. Again, note that counter stage 220 is only able to stall for one clock period for each Stall Enable signal. A more detailed description of operation of the present invention will subsequently be discussed.

As an initial step in operation of the present invention, counter 200 must be programmed using a circuitry illustrated in FIG. 4. First, the stall value, X, which should be provided and stored in stall programmer 240. To determine the stall value, two programming methods may be used. In the first method, if the desired output period is P, an "i" value is calculated such that:

$$2^i \text{ is less than or equal to P, which is less than } 2^i+1. \quad (2)$$

After an "i" value is calculated, P' must be calculated. P' is equal to:

$$P'=P \times 2^{n-i}-2^n. \quad (3)$$

The P' value is rounded to a nearest integer. If P' is equal to $2^n$ then the stall value is equal to a logic zero value and the Select value is equal to the determined "i" value plus 1(i+1). Otherwise, the stall value is equal to P' and the select value equal to the "i" value as determined above.

As an example, assume a P value equal to 6 ⅔ or in decimal value, 6.667, is desired. In this example assume that counter stage 220 has a number of bit (n) equal to 4. In looking at equation (2), it may determine that "i" should be equal to 2. Then, employing equation (3), P' is equal to 10.67. when the P' value is rounded, the P' value is equal to 11. Because the P' value is not equal to $2^4$, or 16, the stall value (X) is not set to zero and the Select (S) value is not set to 3. Rather, the X value is set equal to 11 and the S value is set equal to 2.

In an alternative example, assume that period of 31.9 is desired and that a counter stage to be utilized includes six bits. In this example, using equation (2), "i" should be equal to a value of 4. The "i" value is calculated using equation (2). For small values of P, the equation can be solved by inspection. In this case, it should be noted that 31.9 is between 16 and 32. Therefore, $i=4(2^i)$. For larger values of P, it is helpful to take the base 2 logarithm of equation (2):

$$i < \log_2(P) < i +1. \quad (4)$$

In this form, i is the integer portion of $\log_2(P)$. Therefore, the $\log_2(31.9)=4.9955$, so i=4.

When equation(3) is applied, it is determined that the P' value is equal to 63.6. After rounding, the P' value is set equal to 64 or $2^6$. Because P' is equal to $2^n$, where n is equal to 6, the stall value should be 0 and the S value is equal to "i+1," or 5.

The previous two examples illustrate general programming techniques which may be used in the present invention. A different and more facile technique may be used where floating point data is supported. If the system in which counter 200 is implemented supports a floating point data format, the stall value and the select value can be programmed directly from a floating point representation of the desired period. For example, let E:1.M represent the real number $1.M \times 2^E$, where M (mantissa fraction) and E (exponent) are binary. If the length of M is m, then the range of values of E:1.M, for any given E, is $2^E$ to $2^{E+1}-\frac{1}{2}^{m-E}$, in increments of $\frac{1}{2}^{m-E}$. Therefore, the actual value of E:1.M is $(2^m+M)/2^{m-E}$ Note the similarity to the minimum, maximum, increment, and actual average period of Q[i] which corresponds to $2^i, 2^{i+1}-\frac{1}{2}^{n-i}, \frac{1}{2}^{n-i}, (2^n+X)/2^{n-i}$. The two are identical if i=S (Select Value)=E, n=m, and X (stall value)=M. Stated another way, the select value should be loaded directly from the E value and the stall value should be loaded directly from the M value.

With the proper alignment of the stall value and the select values on the data bus, such alignment will be accomplished by a single move-floating instruction. In actual practice, both the range, which is equal to the length of E, and precision, which is equal to the length of M, of a floating point format are likely to exceed that of the counter having a length of S and a length of X.

Before loading the registers, M should be rounded to n-bit precision, and E should be checked (after rounding) to be within the range 1 to n, where n is equal to a number of bits of the counter. In the example provided above, E is an unbiased exponent. If the floating point data format uses a biased exponent, output multiplexer 260 must compensate for the bias. To compensate for the bias merely requires a reorder of the Q[i] connections to multiplexer 260. Thus, the second method of programming allows the use a floating point number determined by dividing a desired period by a known clock input to counter 200 to determine both the stall value and a select value to be used to enable counter 200 to provide a desired Clock signal.

After programming the stall value into stall programmer 240 and a select value into multiplexer 260, counter 200 is ready to provide the Divided Clock signal. After the stall value has been programmed in stall programmer 240, the Counter Range signal may also be used to modify a period associated with counter 200, even when the stall value is unchanged. For example, if the Counter Range signal is asserted, the range associated with counter 200 is equal to $2^n+1$ to $2^{n+1}$. However, if the Counter Range signal is negated, the range associated with counter 200 is equal to $2^n$ to $2^{n+1}-1$. This range corresponds to the Q[4] signal provided by counter stage 220 to multiplexer 260. Furthermore, it should be noted that the period associated with Q[3] corresponds to ½ of the period associated with Q[4]. Similarly, the period associated with Q[2] corresponds to one-fourth the period associated with Q[4] and the Q[1] value corresponds to one-eighth of the period associated with the Q[4] value.

After the stall value is programmed into stall programmer 240, operation of counter 200 is ready to begin in the present embodiment of the invention. At this point, assume that the value stored in counter stage 220 is equal to 0. That is, there is a 0 stored in each of latches 221, 222, 224, and 226. Furthermore, assume that the value stored in latch 212 is also a 0. Therefore, a value provided by the $\overline{Q}$ output of latch 212 is equal to a logic 1 value. Furthermore, assume that the stall value stored in stall programmer 240 is equal to a value of 5, and that the Counter Range signal is set to a value of 0. A timing diagram associated with the system configured in the manner described above is illustrated in FIG. 5.

As illustrated in FIG. 5, when the count value provided by counter state 220 is equal to 0 and Q[1] through Q[4] have a corresponding value of 0000 and when a value of 0 is stored in latch 221, multiplexer 242 is enabled to access an X[4] value via a "0" input of multiplexer 242. Because a value of "5" (%0101) is provided via the stall value, the value of X[4] is equal to a logic 0 value.

In response to this configuration, the Stall Enable signal has a logic value of 0 and is provided to AND gate 214. Thus, an output of AND gate 214 will also be 0. Because the $\overline{Q}$ output of latch 221 has a logic 1 value which is provided to another input of exclusive-OR gate 216, an output of exclusive-OR gate 216 is a logic 1 value. The output of exclusive-OR gate 216 is subsequently provided to a "D" input of latch 221. Furthermore, an output of AND gate 214 is provided to the "D" input of latch 212. Because the output of AND gate 214 was a logic 0 value, a logic 0 value is stored in latch 212. Additionally, because exclusive-OR gate 216 generated a logic 1 value, that logic 1 value is stored in latch 221. Thus, a "Q" output of latch 221 becomes a logic 1 value in a subsequent operation and enables multiplexer 242 to access a value provided to a "1" input of multiplexer 242. As a result of this first cycle of operation, the count value of counter stage 220 has now increased to a value of 1 (%0001).

In this first count segment, counter stage 220 did not stall counter execution because the Stall Enable signal remains negated throughout the whole operation. Because counter stage 220 has a value of 1 (%0001), a Q output of latch 222 of counter stage 220 has a binary value of 0. Therefore, when that value is provided to multiplexer 244, multiplexer 244 is enabled to select the X[3] input thereto. Because the stall value has the value of 5 (%0101), X[3] has a value of 1. This value of 1 is passed to multiplexer 242 and enables multiplexer 242 to access the "1" input thereto. Thus, the Stall Enable signal has a logic value of 1 and the counter will stall for 1 clock period.

When the term "stalled" is used in the present embodiment of the invention, it is referring to a state in which counter stage 220 does not increment, but maintains its existing state for one clock cycle. After that clock cycle has passed, counter stage 220 continues operating normally until a next stall enable signal is asserted.

As is illustrated in FIG. 5, the value "1" persisted in counter stage 220 for two clock periods after the Stall Enable signal was asserted. A remaining portion of FIG. 5 will not be explained in greater detailed, but may be readily observed by a reader after the foregoing illustrative example of operation of the invention.

From the foregoing example, it may be observed that the stall stage table illustrated in FIG. 3 is implemented by the detailed embodiment illustrated in FIG. 4.

In the implementation of the invention described in FIG. 4 and the timing diagram illustrated in FIG. 5, a relationship between the Stall Enable signal and selected bits of the stall value is illustrated in FIG. 10. FIG. 10 illustrates this relationship in greater detail. It should be noted that the extension to other counter lengths, n, is straight forward and may be easily applied to counters having lengths other than 4 or what is illustrated herein. In this case, the value of the Stall Enable signal is equal to a bit of the stall value, which is determined by n+1, less i, where a bit i of the count value is a least significant zero bit of the count value.

In the present embodiment of the invention, each bit X[i] contributes its binary weight ($2^i$) in extra clock periods. Note, furthermore, that the extra clock period associated with each X[i] are evenly distributed throughout the count sequence. It should be noted that while this is one implementation which works very well for the present embodiment of the invention, there are other truth tables which satisfy the binary weight and uniform distribution criteria set out herein. The truth table illustrated in FIG. 10 has several desirable properties. For example, the logic used is very efficient and requires very low overhead. Additionally, the logic implemented in FIG. 4 and the timing diagram illustrated in FIG. 5 illustrate the use of a sequential counter at very high frequencies.

As illustrated in FIG. 10, the "time since last change" column is a number of clock periods since a last change of each Q[i] bit. The shaded bits are "don't cared". For example, in state 0110, X[4] is selected by Q[1] alone. The Q[2], Q[3], and Q[4] values are "don't cared". An allowable delay from the clock to any Q[i] value is the minimum "care value," (the unshaded value) that appears under the Q[i] value in the "time since last change" column. The allowable delay from the Clock signal to the Q[1] value is one clock period. Additionally, an allowable delay from the Clock signal to the Q[4] value is eight clock periods. Therefore, the allowable delay increases for each higher counter bit and the critical speed path only exists from Q[1] back to a D input of latch 221. It should be noted that none of the other Q values, Q[2], Q[3], or Q[4], are involved in this critical speed path.

An alternate embodiment of the present invention is illustrated in FIG. 6. This embodiment of the present invention is identical to the counter 200 illustrated in FIG. 4 with the addition of exclusive-OR gate 270, exclusive-OR gate 272, exclusive-OR gate 274, exclusive-OR gate 276, and latch 227. In this embodiment of the invention, exclusive-OR gates 270 through 276 are used to translate a binary value provided by counter stage 220 to a Gray code value sequence which is subsequently provided to stall programmer 240. The use of this Gray encoded style sequence allows each bit Q[i] of the counter 200' implemented in FIG. 6 to have an average duty cycle over many periods which is exactly equal to 50%.

The Gray coding causes the Select signal provided to multiplexers 242, 244, 246, and 248 to be embedded on alternate periods of the requisite Q's of latches 221, 222, 224, and 226. This causes the stall value input to each multiplexer to be applied on alternate phases of each Q, at alternate periods. Latch 227 is implemented to keep track of the alternate periods of latch 226. In all other respects, the components of FIG. 6 function in a manner similar to those illustrated in FIG. 4.

As illustrated in FIG. 10, every time Q[1] is a logic 0 value, the Stall Enable signal has the value of the X[4] signal. Conversely, when Q[1] is a logic 1 value, the Stall Enable signal has the value of either X[3], X[2], or X[1], but never the value of X[4]. Thus, if X[4] has a logic 0 value, the low phase of Q[1] will never be stalled and the duration of the low phase of Q[1] can not be longer than the duration of the high phase of Q[1]. Stated another way, the duty cycle of Q[1] can never be less than 50%. Similarly, if X[4] is a logic one value, the low phase Q[1] will always be stalled. Remember, the low phase of Q[1] can never be shorter than the duration of the high phase of Q[1] or, stated another way, the duty cycle of Q[1] can never be greater than 50%.

In order that the duty cycle of Q[1] be exactly 50% on average, the periods of Q[1] with a duty cycle greater than 50% must be offset by periods of Q[1] with a duty cycle less than 50%. This can be accomplished by modifying the select signal of multiplexer 242 to select X[4] using a Q[1] signal having a logic zero value one half of the time and to select X[4] using a Q[1] signal having a logic one value the other half of the time. Exclusive-OR gate 270 accomplishes this modification. Because counter stage 220 counts in a binary sequence, for every two periods of Q[1], Q[2] completes one period. Q[2] is a logic zero value for one period of Q[1] and then a logic one value for the next period of Q[1]. When Q[2] is a logic zero value, X[4] is selected by a zero value of Q[1]. However, when Q[2] is a logic one value, the X[4] value is selected by a one value of Q[1]. A similar analysis will demonstrate that exclusive-OR 272 performs the same function for Q[2]. One half of the time, X[3] is selected by a zero value of Q[2], and the other half of the time, X[3] is selected by a one value of Q[2]. If the sequence of values of Q is a familiar binary counting sequence, it is observed that the sequence of values of GC is also the familiar Gray code sequence.

Figure 7:
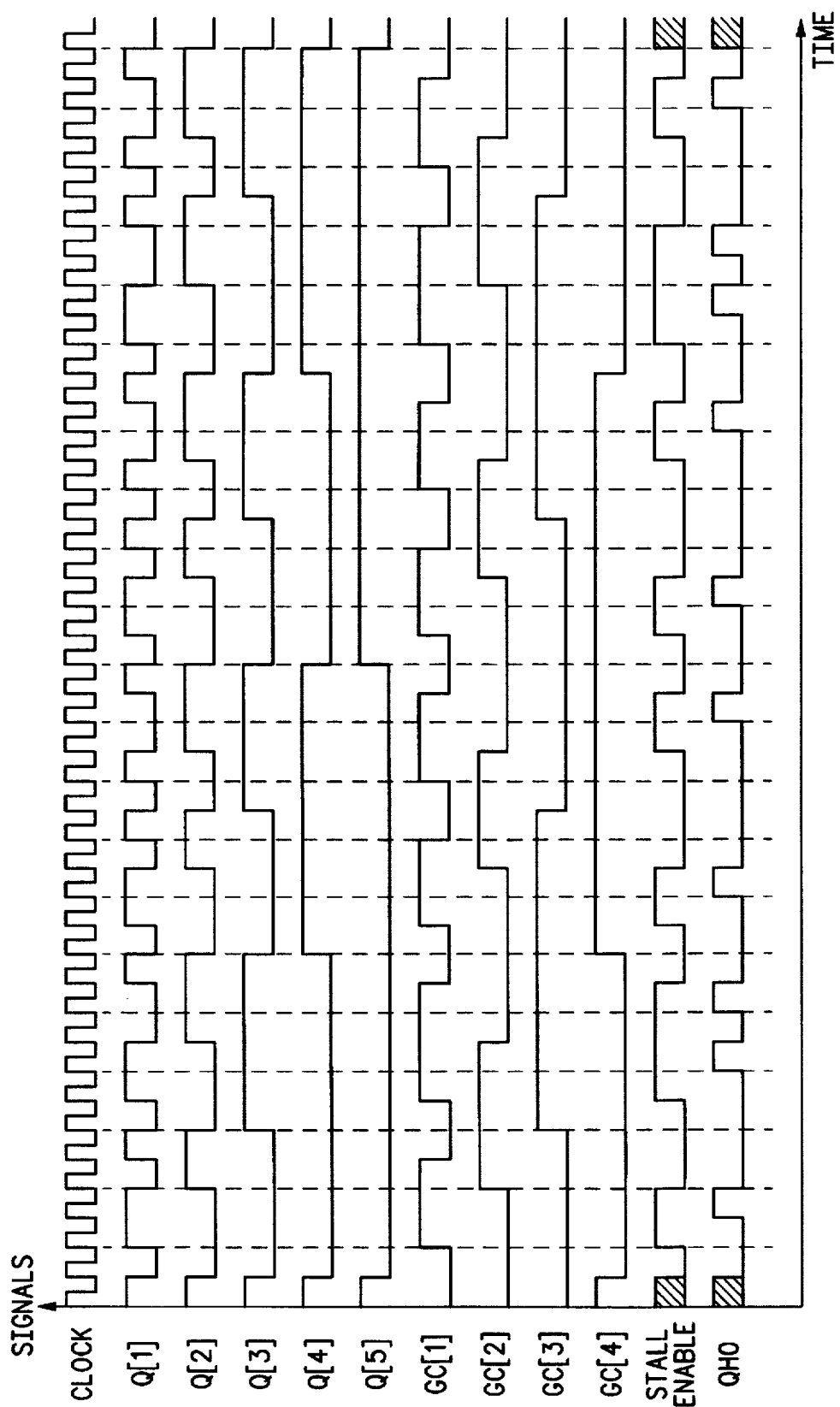
FIG. 7 illustrates, in graphical form, a timing diagram illustrating a second embodiment of the timing signals of the present invention.

FIG. 7 is a timing diagram associated with FIG. 6. FIG. 7 illustrates the binary values associated with counter 200'. Additionally, FIG. 7 illustrates the Gray coded values actually provided to stall programmer 240. These signals, GC[1] through GC[4], are illustrated in FIG. 7. Additionally, the stall operations resulting from the Gray encoded values are illustrated in FIG. 7. It should be understood that with the exception of the Gray encoding provided therein, the circuit illustrated in FIG. 6 functions in a manner similar to that of FIG. 4. Therefore, the description of operation with respect to FIG. 4 is also applicable to the circuit of FIG. 6 and the timing diagram of FIG. 7. From the descriptions provided above, it may be observed that the present invention provides a counting method which is able to generate signals which have an average period of a non-integer multiple of the input clock.

Such a circuit may be used in many different applications. For example, FIG. 8 illustrates a pulse width modulation system which employs the counter of the present invention. It is assumed that pulse width modulator 710 of FIG. 8 requires a divided clock having a specific clock period. Furthermore, it is assumed that the Divided Clock signal and the period associated therewith is a non-integer multiple of the Clock signal provided to divider 200. While the present invention is capable of providing the divided clock signal having a period which is the non-integer multiple of the Clock signal, prior art implementations were unable to do so without requiring excessive circuitry or assembly requirements. In fact prior art implementations were tied to a design which required an integer multiple of a clock signal.

FIG. 9 illustrates a phase lock loop (PLL). As described in the Background section of this patent application, prior art implementations have been able to implement non-integer multiplication and non-integer division of an input clock frequency using two integer dividers as illustrated in FIG. 1. For applications requiring non-integer frequency division, the counter of FIG. 2 may replace the entire phase lock loop of FIG. 1. Also, for applications requiring frequency multiplication, the counter of FIG. 2 can be used to replace the second integer divider 116 of FIG. 1 and allow the first integer divider 110 of FIG. 1 to be eliminated.

When the present invention is used to replace the phase lock loop several advantages exist. For example, phase lock loop circuits traditionally require a significant amount of circuit area, that in turn requires a high amount of overhead. In contrast, the present invention does not require a significant amount of circuitry and adds very little additional logic to circuits which are currently implemented within a counter system. Furthermore, a phase lock loop system typically requires a significant amount of power. In applications which require lower power consumption, the present invention provides a significant advantage over the phase lock loops of prior art implementations. Additionally, phase lock loop implementations were traditionally analog, required an external integrated circuit pin for use, and were traditionally noise sensitive and fabrication sensitive. These sensitivities are diminished by the present invention. Additionally, and most importantly, PLL implementations of prior art systems require a lock-in period. This "lock-in" period often requires a significant amount of time for execution. In contrast the present invention does not require that "lock-in" period or a reset signal, and is able to begin counting when power is first supplied.

The present invention provides a unique and useful apparatus and method for generating signals which have an average period that is a non-integer multiple of a clock signal. The apparatus and method of the present invention may be implemented without requiring a significant amount of overhead, increased power consumption, or analog circuitry.

The implementation of the invention described herein is provided by way of example only, and many other implementations may exist for executing the function described herein. For example, the counter may be implemented either as an asynchronous counter or as a synchronous counter. Additionally, the length of the counter may be modified to any length desired by a user. In the implementations described herein, a counter having a bit length of 4 is used. However, it should be understood that the length may be increased or decreased depending on the needs of the user. Additionally, it should be understood that while the count value of the present invention is implemented as a binary value, that value could also be implemented in another format desired by a user. The alternate format may include ASCII, BCD, or any other format desired by a user.

Additionally, it should be understood that the present invention provides many divided clock signals (Q[1] through Q[4]) and multiplexer 260 selects one particular divided clock of the many. In some applications, it may be useful to provide all the divided clock signals to an external system. Thus, multiplexer 260 may not be required in many applications. This requirement may be useful in some applications. For example, with a binary counter, all of the divided clock signals generated by the present invention have a useful frequency relationship. In this type of application, each $Q[i]$ has a frequency which is exactly double that of $Q[i+1]$. Another way of stating this relationship is that every $Q[i]$ has a frequency which is half that of $Q[i-1]$ and is, thus, a power-of-2 harmonic series. Additionally, in other count formats, additional useful relationships arise. For example, in a BCD counter, ever bit $Q[i]$ has a frequency which is exactly 10 times that of $Q[i+4]$.

The applications described in the present patent application should not be construed as limiting the application of the present invention. For example, the present invention may also be used in applications involving communications, paging applications, and personal digital assistants (PDA). Furthermore, the logic used to implement the present embodiment of the invention may be modified in any manner which does not render the invention un-workable for its present purposes.

While the present invention has been illustrated and described with reference to specific embodiments, further modifications and improvements will occur to those skilled in the art. It is to be understood, therefor, that this invention is not limited to the particular forms illustrated and that the appended claims cover all modifications that do not depart from the scope of this invention.

I claim:

1. A programmable counter comprising:
 a counter stage for receiving a clock signal, and a count enable signal, and producing a count value, wherein the counter stage increments the count value on an active clock edge when the count enable signal is active;
 a stall stage for receiving a stall enable signal, the clock signal, and coupled to the counter stage to provide the count enable signal, wherein the stall stage disables the count enable signal based on the stall enable signal; and
 a stall programmer stage for receiving a stall value, coupled to the counter stage for receiving the count value, and coupled to the stall stage for providing the stall enable signal, wherein the stall enable signal is asserted based on the stall value.

2. The programmable counter of claim 1, wherein the stall value indicates a rate for providing an active stall enable signal.

3. The programmable counter of claim 1, wherein the stall stage disables the count enable signal for an integer number of clock signal cycles.

4. The programmable counter of claim 1, wherein the stall stage disables the count enable signal for N contiguous clock signal cycles out of a total of M contiguous clock signal cycles.

5. The programmable counter of claim 4, wherein N is the integer 1, and M is an integer 2.

6. The programmable counter of claim 1, wherein the count value is a binary count value.

7. The programmable counter of claim 6 further comprising:
 a Gray code stage coupled to receive the count value, and providing Gray code value, wherein the Gray code value is one of a plurality of a Gray code sequence values based on the count value;
 wherein the stall programmer stage is coupled to the Gray code stage to receive the Gray code value.

8. The programmable counter of claim 1 further comprising:
 a multiplexer stage for receiving the count value having a plurality of bits, and providing a divided clock signal, wherein the divided clock signal is a representation of one of the plurality of bits.

9. The programmable counter of claim 8 wherein the divided clock is capable of representing a non-integer division of the clock signal.

10. A method of producing a divided clock signal, the method comprising:
 receiving a stall signal;
 receiving a counter value;
 generating a stall enable signal based on the counter value and the stall signal;
 receiving a clock signal;
 generating a count enable signal based on the stall enable signal;
 incrementing the counter value to create a modified counter value when the clock signal and the count enable signal are both active;
 defining the counter value to equal the incremented counter value;
 repeating the steps of receiving the counter value, generating a stall enable, receiving a clock signal, generating a count enable signal, incrementing, and defining, until the divided clock signal is no longer desired.

11. The method of claim 10, further comprising the steps of:
 receiving the stall signal, wherein the stall signal provides a plurality of stall bits, each of the plurality of stall bits having a stall enable state indicator, wherein each of the plurality of stall bits has a corresponding counter value bit; and
 generating a stall enable signal based on the stall enable state indicator of a one of the plurality of stall bits, wherein the one of the plurality of stall bits is selected based on its corresponding counter value bit.

12. A phase locked loop comprising:
 a controllable frequency oscillator for receiving a phase correction signal, and providing an output frequency based on the phase correction signal;
 a phase comparator for receiving a reference signal having a reference phase, and a divided frequency signal having a divided phase, the phase comparator coupled to the controllable frequency oscillator for providing a phase correction signal based on the reference phase and the divided phase;
 a frequency divider coupled to the controllable frequency oscillator for receiving the output frequency, and coupled to the phase comparator for providing a divided frequency signal, wherein the divided frequency signal represents the output frequency divided by a divisor which can include a non-integer value, the frequency divider comprising:
  a counter stage for receiving a clock signal, and a count enable signal, and producing a count value, wherein the counter stage increments the count value on an active clock edge when the count enable signal is active;
  a stall stage for receiving a stall enable signal, the clock signal, and coupled to the counter stage to provide the count enable signal, wherein the stall stage disables the count enable signal based on the stall enable signal; and a stall programmer stage for receiving a stall value, coupled to the counter stage for receiving the count value, and coupled to the stall stage for providing the stall enable signal, wherein the stall enable signal is asserted based on the stall value.

13. A pulse width modulator system comprising:

a pulse width modulator for receiving a divided clock signal, and providing an output signal having an output clock period and an output clock duty cycle, wherein the clock period is controlled by a frequency of the divided clock signal;

a frequency divider for receiving a system clock, and coupled to the pulse width modulator for providing the divided clock signal, wherein the divided clock signal represents the system clock signal divided by a divisor which can include a non-integer value, the frequency divider comprising:

a counter stage for receiving a clock signal, and a count enable signal, and producing a count value, wherein the counter stage increments the count value on an active clock edge when the count enable signal is active;

a stall stage for receiving a stall enable signal, the clock signal, and coupled to the counter stage to provide the count enable signal, wherein the stall stage disables the count enable signal based on the stall enable signal; and a stall programmer stage for receiving a stall value, coupled to the counter stage for receiving the count value, and coupled to the stall stage for providing the stall enable signal, wherein the stall enable signal is asserted based on the stall value.

* * * * *